United States Patent
Birner et al.

(10) Patent No.: US 7,268,381 B2
(45) Date of Patent: Sep. 11, 2007

(54) MEMORY CELL WITH TRENCH CAPACITOR AND VERTICAL SELECT TRANSISTOR AND AN ANNULAR CONTACT-MAKING REGION FORMED BETWEEN THEM

(75) Inventors: Albert Birner, Dresden (DE); Matthias Goldbach, Dresden (DE); Till Schlösser, Dresden (DE)

(73) Assignee: Infineon Technologies AG (DE)

( * ) Notice: Subject to any disclaimer, the term of this patent is extended or adjusted under 35 U.S.C. 154(b) by 92 days.

(21) Appl. No.: 10/486,758

(22) PCT Filed: Jul. 12, 2002

(86) PCT No.: PCT/DE02/02559

§ 371 (c)(1),
(2), (4) Date: Jul. 12, 2004

(87) PCT Pub. No.: WO03/017331

PCT Pub. Date: Feb. 27, 2003

(65) Prior Publication Data

US 2004/0232466 A1    Nov. 25, 2004

(30) Foreign Application Priority Data

Aug. 14, 2001  (DE) ................. 101 39 827

(51) Int. Cl.
*H01L 27/108*  (2006.01)
*H01L 29/76*  (2006.01)

(52) U.S. Cl. .................... 257/301; 257/302
(58) Field of Classification Search ......... 257/301–304

See application file for complete search history.

(56) References Cited

U.S. PATENT DOCUMENTS

| | | | |
|---|---|---|---|
| 5,641,694 A | * | 6/1997 | Kenney .................... 438/156 |
| 6,137,128 A | | 10/2000 | Holmes et al. |
| 6,144,054 A | | 11/2000 | Agahi et al. |
| 6,262,448 B1 | * | 7/2001 | Enders et al. ............ 257/302 |
| 6,608,341 B2 | * | 8/2003 | Schrems ................... 257/301 |

FOREIGN PATENT DOCUMENTS

| | | |
|---|---|---|
| DE | 198 44 997 A1 | 9/1998 |
| DE | 199 42 012 A1 | 9/1999 |
| DE | 199 46 719 A1 | 9/1999 |
| EP | 0 905 771 A2 | 8/1998 |

(Continued)

OTHER PUBLICATIONS

Hyun-Jin Cho et al., "A Novel Pillar DRAM Cell for 4 Gbit and Beyond", VLSI Technology, 1998. Digest of Technical Papers. 1998. Symposium on Honolulu, Hi, USA Jun. 9-11, 1998, New York, NY USA, IEEE, US, pp. 38-39.

(Continued)

*Primary Examiner*—Theresa Doan
(74) *Attorney, Agent, or Firm*—Brinks Hofer Gilson & Lione (57) ABSTRACT

The upper capacitor electrode of the trench capacitor is connected to an epitaxially grown source/drain region of the select transistor by a tubular, monocrystalline Si contact-making region. The gate electrode layer has an oval peripheral contour around the transistor, the oval peripheral contours of the gate electrode layers of memory cells arranged in a row along a word line forming overlap regions in order to increase the packing density.

17 Claims, 5 Drawing Sheets

FOREIGN PATENT DOCUMENTS

| | | | |
|---|---|---|---|
| EP | 0 905 772 | A2 | 8/1998 |
| EP | 1 071 129 | A2 | 7/2000 |
| EP | 1 077 487 | A2 | 8/2000 |

OTHER PUBLICATIONS

K. Yamada et al., "A Deep-Trenched Capacitor Technology for 4 MEGA Bit Dynamic RAM", UEDM 85, p. 702, 1985.

* cited by examiner

MEMORY CELL WITH TRENCH CAPACITOR AND VERTICAL SELECT TRANSISTOR AND AN ANNULAR CONTACT-MAKING REGION FORMED BETWEEN THEM

PRIORITY CLAIM

This application is related to and claims the benefit of priority under 35 U.S.C. §§ 120, 271, and 365 to Patent Cooperation Treaty patent application no. PCT/DE02/02559, filed on Jul. 12, 2002, which was published at WO1017331, in German.

This application is further related to and claims the benefit of priority under 35 U.S.C. § 119 to the filing date of Aug. 14, 2001 German patent application no. DE 101 39 827.1, filed on Aug. 14, 2001.

BACKGROUND

1. Technical Field

The invention relates to a memory cell in accordance with the preamble of patent claim 1 and to memory cell arrangements which are composed of such memory cells. The invention also relates to a method for fabricating a memory cell and a memory cell arrangement.

2. Background Information

In dynamic random access memory cell arrangements, it is virtually exclusively what are known as single-transistor memory cells which are used. A single-transistor memory cell comprises a read or select transistor and a storage capacitor. The information is stored in the storage capacitor in the form of an electric charge which represents a logic 0 or a logic 1. Actuating the read transistor via a word line allows this information to be read via a bit line. The storage capacitor must have a minimum capacitance for reliable storage of the charge and, at the same time, to make it possible to differentiate the information item which has been read. The lower limit for the capacitance of the storage capacitor is currently considered to be 25 fF.

Since the storage density increases from memory generation to memory generation, the surface area required by the single-transistor memory cell must be reduced from generation to generation. At the same time, the minimum capacitance of the storage capacitor has to be retained.

Up to the 1 Mbit generation, both the read transistor and the storage capacitor were produced as planar components. Beyond the 4 Mbit memory generation, the area taken up by the memory cell was reduced further by using a three-dimensional arrangement of read transistor and storage capacitor. One possibility is for the capacitor to be produced in a trench (cf. for 5 example K. Yamada et al., Proc. Intern. Electronic Devices and Materials IEDM 85, pp. 702 ff). In this case, a diffusion region which adjoins the wall of the trench and a doped polysilicon filling arranged in the trench act as electrodes for the storage capacitor. Therefore, the electrodes of the storage capacitor are arranged along the surface of the trench. In this way, the effective surface area of the storage capacitor, on which the capacitance is dependent, is increased with respect to the space taken up by the storage capacitor on the surface of the substrate, which corresponds to the cross section of the trench.

In the memory cells which have been in series production since the 4 Mbit memory generation, the upper capacitor electrode of the trench capacitor is electrically connected to a horizontal select transistor, which is arranged above the trench capacitor and laterally offset with respect thereto, via a conductive bridge of polycrystalline silicon. However, an arrangement of this type, on account of the horizontally oriented select transistor, requires a relatively large amount of space, so that a further increase in the packing density of the memory cells is only possible to a limited extent.

For some time, therefore, a different variant of a memory cell with trench capacitor has been proposed, in which the select transistor is arranged as a vertical MOSFET transistor directly above the trench capacitor.

EP 1 077 487 A2 describes a DRAM memory cell with trench capacitor in which a capacitor is formed in a lower section of a trench formed in a semiconductor substrate and a select transistor is formed in an upper section of the trench. In this case, the channel region of the select transistor extends along the side wall of the trench, between a first source/drain connection, which is coupled to the upper capacitor electrode of the trench capacitor, and a second source/drain connection, which is arranged close to the substrate surface. The gate electrode is situated in the trench above the capacitor, and there is a gate oxide layer at the interface with the channel region. The drawback of this arrangement is the relatively long channel length of the select transistor and the resulting poor controllability and slow response time of the select transistor.

U.S. Pat. No. 6,137,128 has disclosed a memory cell having a trench capacitor which has a trench which is formed into a semiconductor substrate, in the lower trench region of which a lower capacitor electrode adjoins a wall of the trench and into which trench a storage dielectric and an electrically conductive trench filling comprising polycrystalline silicon as upper capacitor electrode are introduced. A vertical MOSFET is arranged above the trench capacitor as select transistor, both the gate and the source, drain and channel region being formed as regions which encircle a central insulation layer in the shape of a ring. Therefore, a drawback is that the source-drain current of the MOSFET fans out in the shape of a ring, and a further drawback is that it is necessary to form an insulation collar in order to insulate the lower source/drain region of the MOSFET from the lower buried capacitor electrode of the trench capacitor.

The generic document EP 0 905 772 A2 has likewise described a DRAM memory cell and a method for its fabrication in which a vertical MOSFET is formed as select transistor above a trench capacitor, which is filled with polycrystalline silicon as upper capacitor electrode. The MOSFET has a first n-doped source/drain region, a p-doped channel region and a second n-doped source/drain region, which are deposited on the poly-crystalline silicon of the trench filling substantially by epitaxy. This layer sequence is vertically structured in such a manner that it has a square cross section, and a gate electrode layer, which covers the four sides and surrounds the layer sequence, is deposited at the level of the channel region. One drawback of this method is that the MOSFET is grown substantially epitaxially on the polysilicon of the trench filling, with the result that defects and grain boundaries are introduced into the MOSFET. A further drawback is that prior to the fabrication of the MOSFET a vertical etching into a highly doped polysilicon layer which covers the substrate with the trench capacitor is carried out directly above the trench capacitor, and then the gate oxide is applied directly to the etched side walls, and consequently the gate oxide is not of an optimum quality. A further drawback is that the form of the gate electrode of the vertical MOSFET which surrounds the channel region does not allow optimum passage of the gate electrode potential through the channel region. A further drawback is that the memory cell arrangement illustrated and the arrangement of the memory cells in rows along the word line formed by the gate electrodes does not allow a high packing density to be achieved.

BRIEF SUMMARY

Accordingly, it is an object of the present invention to provide a memory cell having a trench capacitor and a vertical select transistor, with which firstly it is possible to achieve a high storage density and in which secondly both the trench capacitor and the select transistor can be fabricated with good electrical performance properties.

It is a further object of the present invention to provide an improved method for fabricating a memory cell with trench capacitor and vertical select transistor and a memory cell arrangement therefrom, with which it is possible to fabricate a corresponding memory cell with improved properties and a memory cell arrangement with a higher packing density.

These objects are achieved by the characterizing features of the independent patent claims. Further configurations and refinements are given in the subclaims.

A first aspect of the present invention relates to a memory cell, having a trench capacitor, which has a trench which is formed into a semiconductor substrate, in the lower trench region of which trench a lower capacitor electrode adjoins a wall of the trench, and into which trench a storage dielectric and an electrically conductive trench filling as upper capacitor electrode are introduced, and a vertical field-effect transistor, which is arranged above the trench capacitor, as select transistor. The upper capacitor electrode is connected to a first source/drain region of the select transistor by a contact-making region which at least partially surrounds the periphery of its upper end section.

In this case, there is preferably no direct mechanical and electrical connection between the upper capacitor electrode and the select transistor, so that this connection is preferably provided only by the contact-making region.

Connecting the trench capacitor and the select transistor by means of the peripheral contact-making region makes it possible to produce the select transistor with a good crystalline quality and good electrical performance properties. This is because if the contact-making region is fabricated preferentially from substantially monocrystalline doped semiconductor material, the select transistor can be deposited thereon by epitaxial growth and can therefore be produced from a semiconductor material with a good crystalline quality.

The contact-making region may advantageously be created in such a manner that it surrounds the upper end section of the upper capacitor electrode, i.e. the electrically conductive trench filling, in the form of a ring or tube, i.e. completely surrounds the upper end section on the peripheral side. If the contact-making region is in the form of a tube, its lower section can surround the upper end section of the upper capacitor electrode in the manner of a tube or flange, and its upper section can surround the source/drain region of the select transistor in the manner of a tube or flange.

The term "in the form of a ring or tube" does not in any way imply a specific, approximately circular tube cross section. Rather, the trench in this section may have any conceivable cross section.

As has already been indicated, the upper capacitor electrode is preferably not in direct mechanical contact with the source/drain region of the select transistor. The reason for this is that the trench filling which forms the upper capacitor electrode is generally provided by doped polycrystalline silicon. During the deposition of the crystalline semiconductor layers of the MOSFET select transistor, the epitaxial growth should take place only on the monocrystalline contact-making region, but not also on the polysilicon of the trench filling. Therefore, an insulation layer, preferably a silicon oxide layer (TTO, Trench Top Oxide}, is deposited on the surface of the upper end section of the polysilicon trench filling.

For the same reason, an interlayer may be arranged between the contact-making region, which is produced from monocrystalline semiconductor material, and the polysilicon of the upper end section of the upper capacitor electrode, in order to prevent crystal defects from propagating from the polysilicon into the contact-making region. However, this interlayer must not impede the electrical connection between these regions, i.e. it is formed, for example, as an ultra-thin tunnel contact layer, for example comprising silicon nitride.

An insulation layer, for example an oxide layer, is preferably inserted between the contact-making region and the semiconductor substrate, in order on the one hand to electrically insulate the contact-making region from the substrate and on the other hand to avoid out diffusion from the contact-making region into the substrate.

The select transistor of the memory cell is a field-effect transistor which has a layer structure comprising the first source/drain layer which adjoins the annular contact-making region, a channel layer and a second source/drain layer. The layer sequence of the field-effect transistor may be vertically structured in such a manner that it has a substantially oval cross section, the layer sequence, at least in the region of the channel layer, being surrounded by a gate electrode layer with a substantially oval peripheral contour and by a gate oxide layer located between them.

The advantage of a MOSFET transistor formed in this way is that firstly good passage of the gate electrode potential through the channel region is provided, and that secondly the oval shape of the gate electrodes can be used in order, in a memory cell arrangement, for the memory cells which are fitted together along one direction to be arranged as close together as possible.

A MOSFET transistor of this type can therefore advantageously be used as a select transistor in a memory cell according to the invention. In this case, the layer sequence of the MOSFET transistor can be deposited, for example, on the TTO insulation layer and epitaxially on the contact-making region.

In an embodiment of a memory cell which makes use of the MOSFET transistor described above, by way of example the trench capacitor is formed in the semi-conductor substrate and an insulation layer, within which the gate electrode layer is formed, is deposited on the semiconductor substrate. One advantage of a design of this type is that there is no need for STI (shallow trench isolation) regions to be etched and filled with an insulator in order to isolate the individual memory cells, as is the case in other designs.

In one embodiment of a memory cell according to the invention which includes a select transistor as described above and in which the trench capacitor is formed in the semiconductor substrate and an insulation layer is deposited on the semiconductor substrate, the gate electrode layer being formed within this insulation layer, by way of example, the contact-making region may lead as far semiconductor substrate and as the interface between insulation layer.

Furthermore, it is possible for a plurality of memory cells, which each include field-effect transistors as select transistors as described above, to be combined in a memory cell arrangement in which a number of memory cells are arranged in one direction, with the gate electrode layers of adjacent memory cells being fitted together in such a manner that their oval peripheral contours overlap one another in a section and the gate electrode layers coincide in this section.

This arrangement allows a tightly packed integration of memory cells in said direction.

An arrangement of this type can be refined if a number of memory cells are arranged in the form of a matrix and can be driven by word lines and bit lines, and the word line is formed by gate electrode regions of memory cells arranged along one of two orthogonal directions, and the bit lines run over the select transistors in the other of the two orthogonal directions and are in each case electrically connected to the second source/drain layers thereof.

The invention also relates to a method for fabricating a memory cell which includes a trench capacitor and a vertical field-effect transistor arranged above the trench capacitor, the method comprising the steps of: applying an insulation layer to a semiconductor substrate; forming a trench which extends through the insulation layer and a section of the substrate; laterally widening the substrate trench section by isotropic and/or anisotropic etching, and thereby producing a substantially annular contact-making region; applying an insulation layer to the lateral inner wall of the substrate trench section; epitaxially growing a semiconductor layer which completely fills the substrate trench section; removing the semiconductor layer apart from the annular contact-making region; making the trench deeper; providing a lower capacitor electrode, which in the lower trench region adjoins a wall of the trench, a storage dielectric and an upper capacitor electrode, with which the trench is filled at least up to the lower edge of the contact-making region; making electrical contact with the upper capacitor electrode by means of the contact-making region; and epitaxially growing the layer sequence of the field-effect transistor on the contact-making region and the insulation layer.

After electrical contact has been made with the upper capacitor electrode by means of the contact-making region, an insulation layer, known as a TTO (Trench Top Oxide) layer, can be formed on the upper capacitor electrode. Since the upper capacitor electrode is often formed from polysilicon, it is in this way possible to prevent direct mechanical contact between the polysilicon and the crystalline silicon of the transistor and therefore to prevent crystal defects from propagating into it.

BRIEF DESCRIPTION OF THE DRAWINGS

The invention is explained in more detail below with reference to an exemplary embodiment relating to the fabrication of a memory cell according to the invention and of a memory cell arrangement in matrix form. In the drawing.

DETAILED DESCRIPTION

FIGS. 1 to 8 each show a cross section through a memory cell which is to be processed, along a plane which symmetrically divides the trench.

Figure 1:
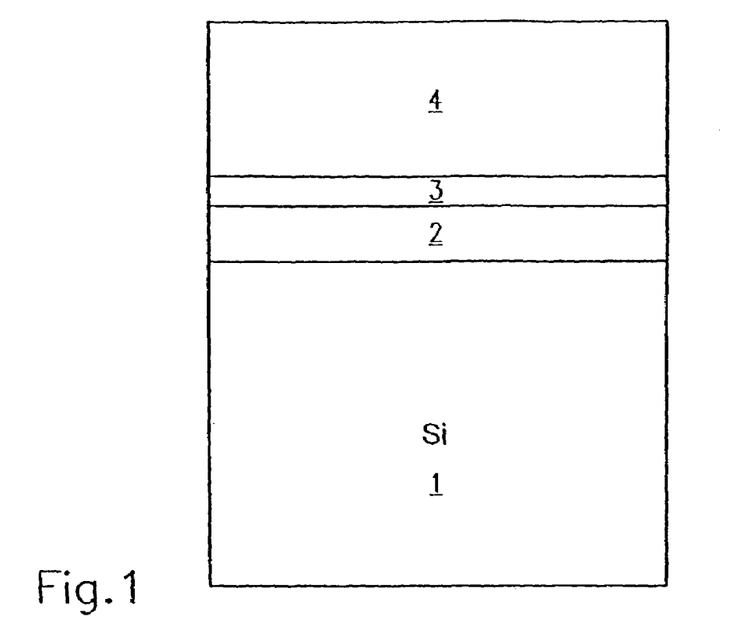
FIG. 1 shows a semiconductor substrate with applied etching mask layers.

In accordance with FIG. 1, first of all an approx. 200 nm thick STI (shallow trench isolation) layer 2 comprising $SiO_2$ is deposited on a monocrystalline silicon substrate 1; this layer is used to isolate the complete memory cells from one another, as will be seen below. Then, an approx. 100 nm thick first mask layer 3 comprising SiN is deposited on the STI layer, and a second mask layer 4 comprising $SiO_2$ is deposited on the first mask layer. These layers are used as hard mask layers during the subsequent etching processes.

Then, regions in which trenches 5 are to be etched are defined by means of conventional photolithography and resist technology. First of all, a first etching process is used to produce a trench in these regions, which trench extends through the STI layer 2 and in the substrate produces a first trench section 5A, which has a depth of approx. 200 nm below the main surface of the substrate 1. This depth defines the length of the contact-making section which is subsequently to be produced.

The trenches 5 are generally of a form which is elongate in cross section, for example are in the shape of a rectangle with edge lengths of approx. 100 nm×250 nm or an oval with corresponding length and transverse dimensions. On the mask side, rectangles of the given dimensions are generally provided, but in practice the small dimensions mean that oval-shaped trenches are generally produced. A matrix-like arrangement of such trenches 5, which are at a distance 100 nm from one another in both orthogonal is produced in accordance with the of the memory cells which are to be produced.

Figure 2:
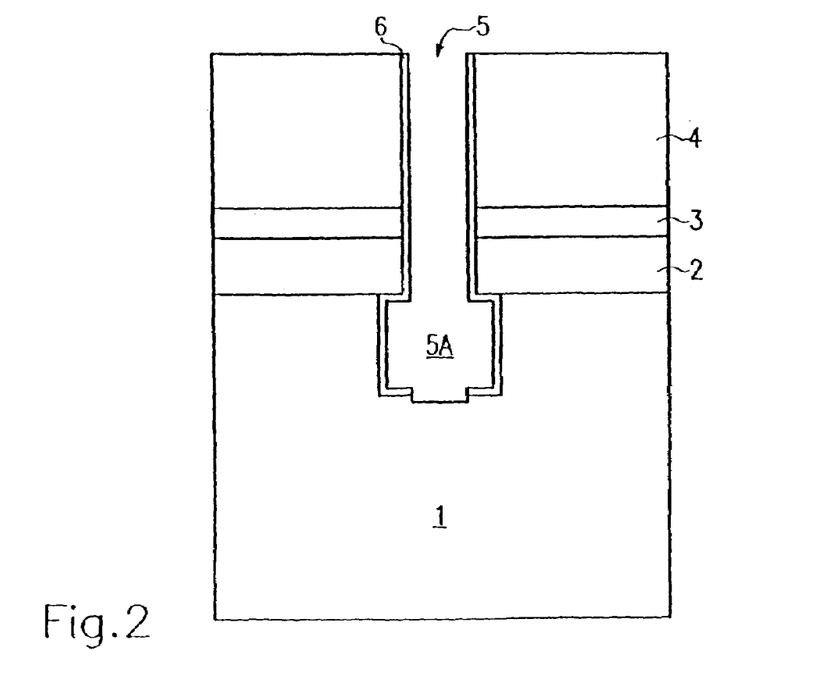
FIG. 2 shows the memory cell after the selective removal of the oxide layer which has been deposited in the trench in the base region.

Then, the first trench section 5A is widened by a few tens of nm on all sides by isotropic etching, so that the width of the annular contact-making section is defined. An interlayer 6 (liner) comprising $SiO_2$, which in the trench section 5A will have the function of electrically insulating the contact-making region which is to be produced from the substrate 1 and of preventing diffusion out of the contact-making region into the substrate 1, is deposited in the trench 5 which has been produced in this way. By means of an anisotropic etching process, the interlayer 6 is removed again in the base region on a section which approximately corresponds to the original dimensions of the trench 5. The result of these method steps is illustrated in FIG. 2.

Figure 3:
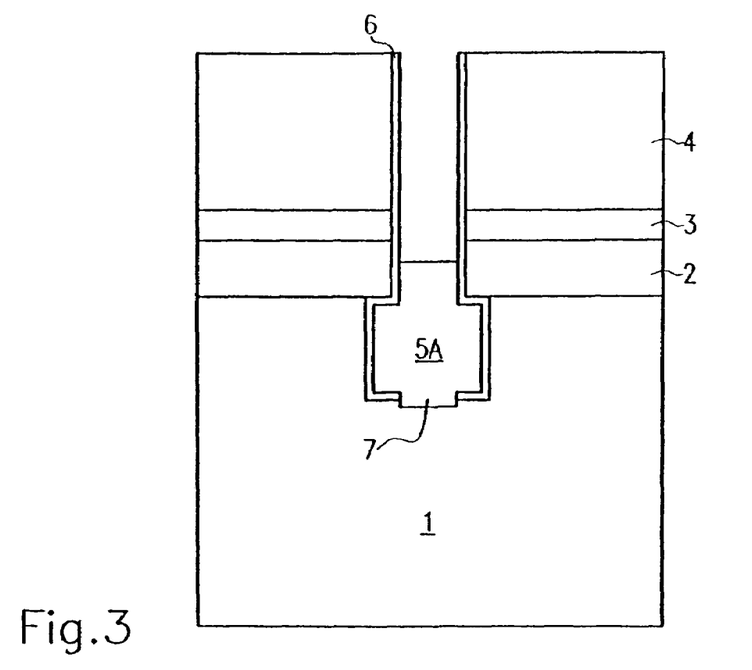
FIG. 3 shows the memory cell after the epitaxial growth of monocrystalline silicon in the widened trench section.

FIG. 3 illustrates how a silicon filling 7 is then deposited in the trench section 5A by selective epitaxy, for example by means of a CVD process or the like, so that the filling completely fills the trench section 5A. Since the silicon filling 7 is produced by epitaxy on the silicon of the substrate 1, it can be fabricated with a good crystalline quality. During this deposition, in-situ doping can be carried out, in order to provide sufficient electrical conductivity of the contact-making region which is to be formed from the silicon filling 7. However, it is also possible for the silicon initially to be deposited in nominally undoped form and for the doping to be introduced in a subsequent method step, as will be seen below. The result of these method steps is illustrated in FIG. 3.

Then, the epitaxially grown silicon filling 7 is removed again in a region which corresponds to the cross section of the original trench 5, by means of an anisotropic etching process, so that an annular contact-making region 7.1 comprising doped, substantially monocrystalline silicon remains. In the present case, the annular contact-making region has an oval peripheral contour, since—as has already been pointed out—the trench 5 is oval in cross section.

Figure 4:
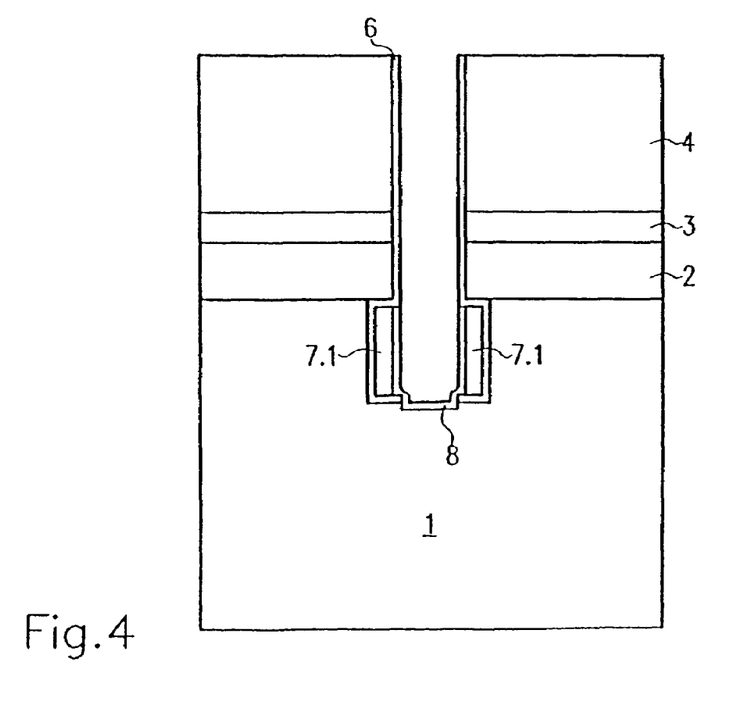
FIG. 4 shows the memory cell after the deposition of an oxide layer on the wall of the contact-making region and the base region.

Then, an approx. 5 nm thick oxidation layer (SiO2) 8 is provided (deposited or produced by thermal oxidation) on the inner wall of the annular contact-making region 7.1, which oxidation layer on the one hand serves as etching protection and furthermore has the function of shielding the annular contact-making region 7.1 during a doping step which is subsequently to be carried out, in order in this way to maintain a doping which has already been preset. The oxidation layer 8 is produced in the entire trench but is only illustrated in the trench section 5A. The result of these method steps is illustrated in FIG. 4.

Then, an anisotropic etching process is used to make the trench 5 deeper, thus producing a second trench section 5B, in which the trench capacitor is to be fabricated. Then, by doping the silicon substrate 1 in the second trench section 5B, it is first of all possible to provide the lower capacitor electrode (not shown), in a manner which is known per se. If desired, the contact-making region 7.1 can be doped at the same time as this doping—as has already been indicated above—so that in FIG. 3 the silicon filling 7 does not have to be doped in situ, and the oxidation layer 8 can be made thinner or can be omitted altogether.

It is also possible for the lower capacitor electrode to be provided by depositing a metallic layer in the second trench section 5B, as has been described, for example, in DE 199 44 012. In this case it is also preferable for prior doping to be carried out, in order to produce an ohmic contact to the silicon substrate 1.

After the fabrication of the lower capacitor electrode, a dielectric layer 9 with a thickness of approximately 5 nm, which may contain SiO2 and/or Si3N4, and if appropriate silicon oxynitride or also Al2O3, TaoS or TiO2 (if appropriate with additions of hafnium and/or zirconium), is deposited in the second trench section 5B as capacitor dielectric in a manner which is known per se.

Figure 5:
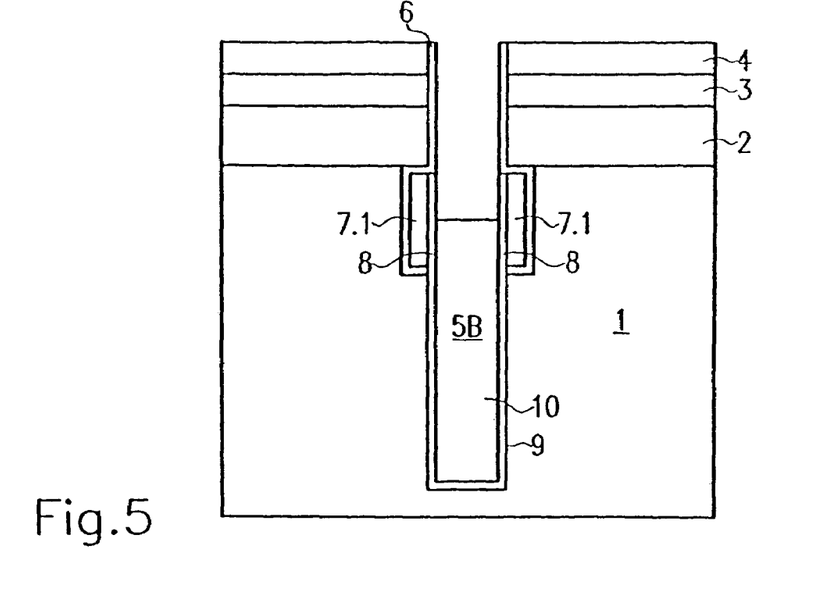
FIG. 5 shows the memory cell after the trench has been made deeper and after the dielectric and the upper capacitor electrode have been formed.

Then, the upper capacitor electrode 10 is introduced in a manner which is known per se. In the most simple case, this electrode is doped polysilicon with which initially the trench is completely filled and which is then etched back again, so that in the trench it has a filling height which rises approximately as far as the central region of the contact-making region 7.1. Then, the dielectric layer 9 is removed above this. The result of these method steps is illustrated in FIG. 5.

Figure 6:
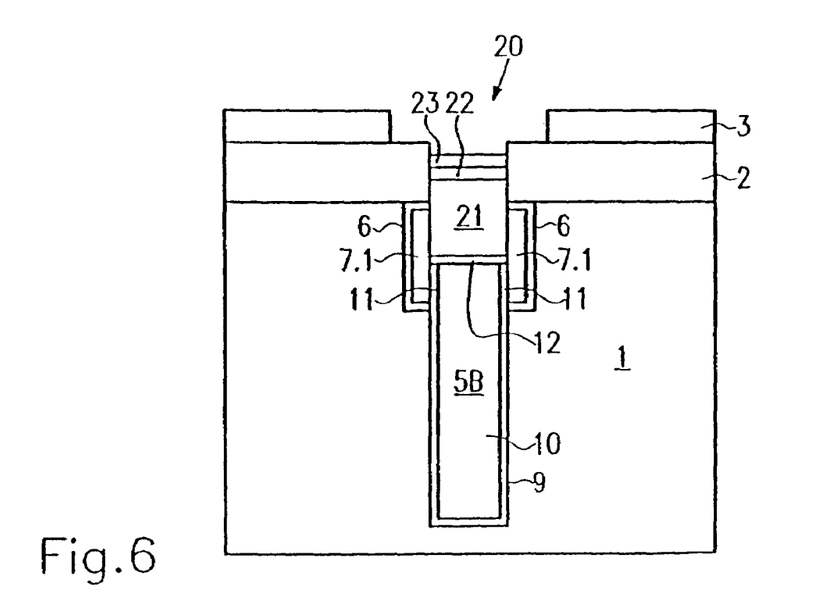
FIG. 6 shows the memory cell after the epitaxial growth of the layer sequence of the MOSFET.

Then, the SiO2 layer 4, the oxidation layer 6 located in the upper trench section on the layers 2 and 3 and the oxidation layer 8 are removed by means of an etching step. Then, as shown in FIG. 6, the SiN mask layer 3 is uniformly recessed from the trench edge and simultaneously thinned by means of an isotropic etch. As will be seen below, this measure already prepares for the gate electrodes which are yet to be produced.

Then, in the lower section of the contact-making region 7.1, this region has to be connected in an electrically conductive manner to the polysilicon of the upper capacitor electrode 10, since a gap has formed between them as a result of the previous removal of the oxidation layer 8 located therebetween. This connection can be produced in two different ways. In the variant which is illustrated, a tunnel contact layer 11 of SiN, which is only approximately 0.5 nm thick, is produced on the polysilicon, and then the space remaining between the contact-making region 7.1 and the upper capacitor electrode 10 is filled by depositing a polycrystalline silicon layer and subsequently removing it outside this space. The tunnel contact layer 11 is intended to avoid direct mechanical contact between the polysilicon of the upper capacitor electrode and the monocrystalline silicon of the contact-making region 7.1 and therefore the propagation of crystal defects. However, should the tunnel contact layer 11 not be required, it can also be omitted, and instead the contact-making region 7.1 can be connected to the upper capacitor electrode 10 by means of a reflow process, in which polysilicon flows into the space as a result of a heat treatment step.

Then, an insulation layer 12 (TTO, Trench Top Oxide) is applied to the surface of the upper capacitor electrode 10, for example by means of HDP (high density plasma) oxide deposition and subsequent isotropic etching back. This insulation layer 12 is advantageous since it isolates the polysilicon 5B of the trench filling from the crystalline silicon of the transistor which is subsequently to be grown on epitaxially, and thereby prevents crystal defects from propagating from the polysilicon into the crystalline silicon. However, if appropriate the insulation layer 12 can also be omitted if there is no risk of the crystalline silicon above being impaired. This may be the case, for example, if the trench filling in the upper region is formed not from polysilicon, but rather from another electrically conductive material.

Then, the upper region of the trench is filled by means of selective silicon epitaxy, and in the process the MOSFET select transistor 20 of the memory cell is fabricated. In the process, first of all an n-doped first source/drain layer 21 is grown, and then a p-doped channel layer 22 is deposited on this first source/drain layer, and finally an n-doped second source/drain layer 23 is applied to the p-doped channel layer. Next, the remainder of the SiO2 mask layer 4 and of the SiN mask layer 3 is removed. The result of these method steps is illustrated in FIG. 6.

A select transistor 20 of this type is also known as a floating body transistor, since it is not built up on a substrate with a constant electric potential.

Since the layer sequence of the select transistor 20 is formed in the upper trench section, located inside the STI layer 2, in cross section it has the same structure as that of the etched trench 5, i.e. preferably has an oval structure.

Then, the select transistor 20 is completed. For this purpose, first of all an anisotropic etching step is used to remove the section of the STI layer 2 which has been uncovered by the previous recessing of the SiN layer 3, thus creating space for the gate electrode 24, as illustrated as a result in FIG. 7. This anisotropic etching step is a self-aligned process, by means of which a trench in the STI layer 2, the contour of which is matched to the cross section of the trench 5 which was initially etched and therefore now to the cross section of the uncovered layer sequence of the select transistor 20, is produced around the layer sequence of the select transistor 20. As has already been mentioned a number of times, the peripheral contour of this trench produced by the anisotropic etching is preferably of elongate, in particular oval shape. If the trench 5 which was originally etched already has a substantially oval cross section, the gate electrode layer 24 which is subsequently to be produced in the trench will also be fabricated with an oval peripheral contour which is at an identical distance from the layer sequence of the select transistor 20 at any point.

Figure 7:
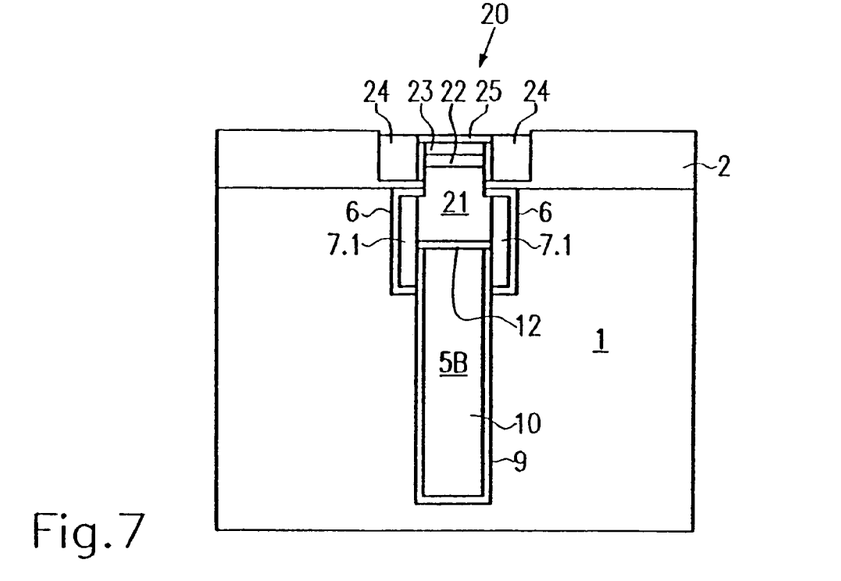
FIG. 7 shows the memory cell after the gate electrode layer has been formed.

Since the STI etching—as has already been mentioned is carried out by means of a self-aligned process, the lithography step which is usually provided at this point using the so-called AA mask is dispensed with.

After the production of this oval trench, a gate oxide layer 25 is produced on the uncovered layer sequence of the select transistor 20, for example by thermal oxidation. The peripheral contour of this gate oxide layer 25 is likewise matched to the cross section of the layer sequence which has been etched clear and therefore preferably has an oval peripheral contour. The horizontal layer section of the gate oxide layer 25 on the source/drain layer 23 is then removed again by means of an etching step.

Figure 9:
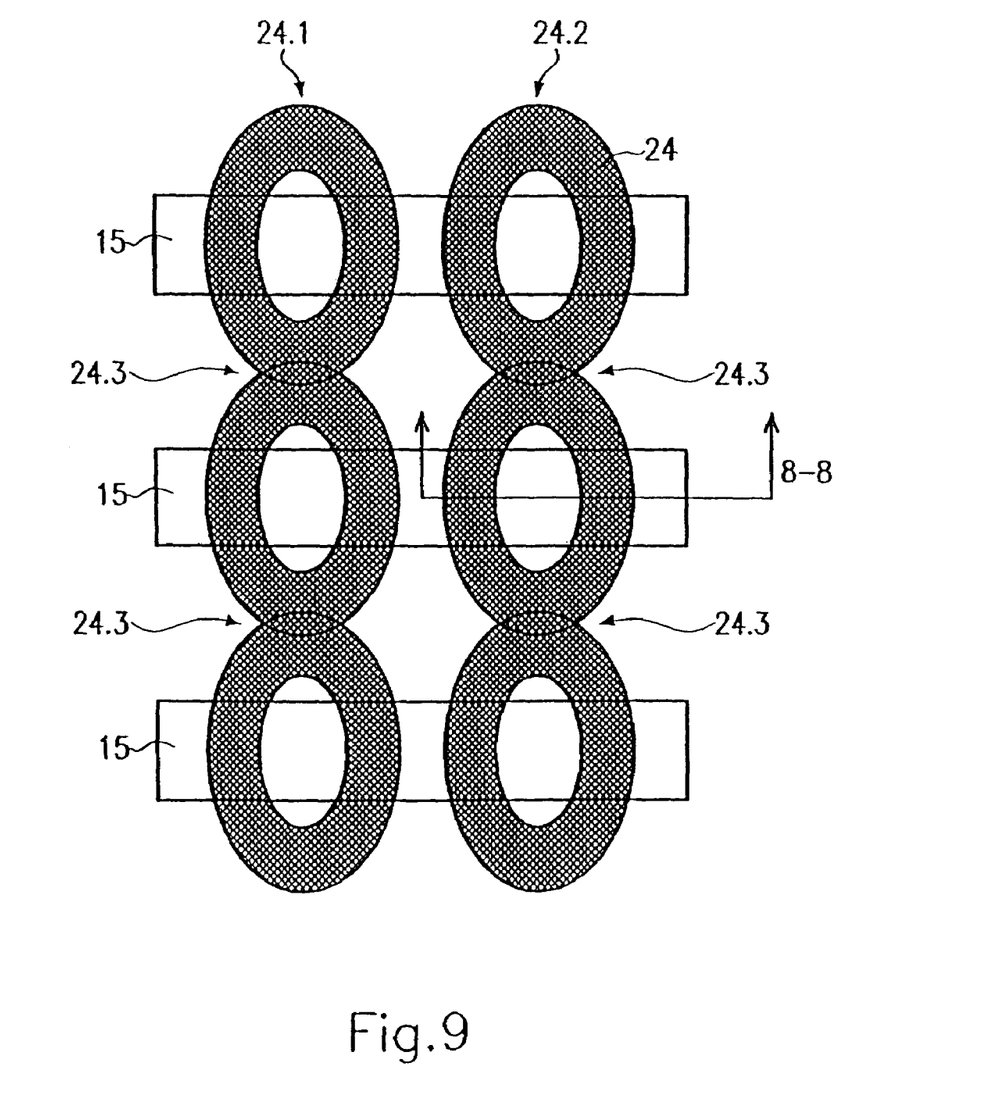
FIG. 9 shows a plan view of a memory cell arrangement in matrix form with word lines and bit lines.

As illustrated in FIG. 9, the trenches in a matrix-like memory arrangement are furthermore etched in such a manner that overlap regions 24.3 are produced between the oval peripheral contours of memory cells which have been fitted together along one orthogonal direction. The fact that the oval trenches of the individual memory cells are fitted together with an overlap in such a manner allows the memory cells to be arranged closely together and therefore allows large-scale integration of the memory cells on the chip. This overlap therefore also results in lines which can subsequently be used as word lines for addressing the memory. The word lines to a certain extent wind their way from one trench region to the next, around the transistors. Therefore, in FIG. 9, two word lines 24.1 and 24.2 in the vertical direction, which are crossed by three bit lines in the horizontal direction, from the entire memory arrangement are illustrated. The memory cells are located below the crossing points.

In the arrangement illustrated in FIG. 9, word lines and bit lines run precisely orthogonally to one another and the memory cells of adjacent word lines 24.1, 24.2 are arranged next to one another at precisely the same height. An alternative arrangement with an even higher packing density provides for the memory cells to be vertically offset from one another by precisely half the spacing, so that the height of one memory cell on one word line lies between two memory cells belonging to the adjacent word line. As a result of this offset, it is necessary for the bit lines no longer to run orthogonally, but rather to run at an oblique angle to the word lines.

Figure 8:
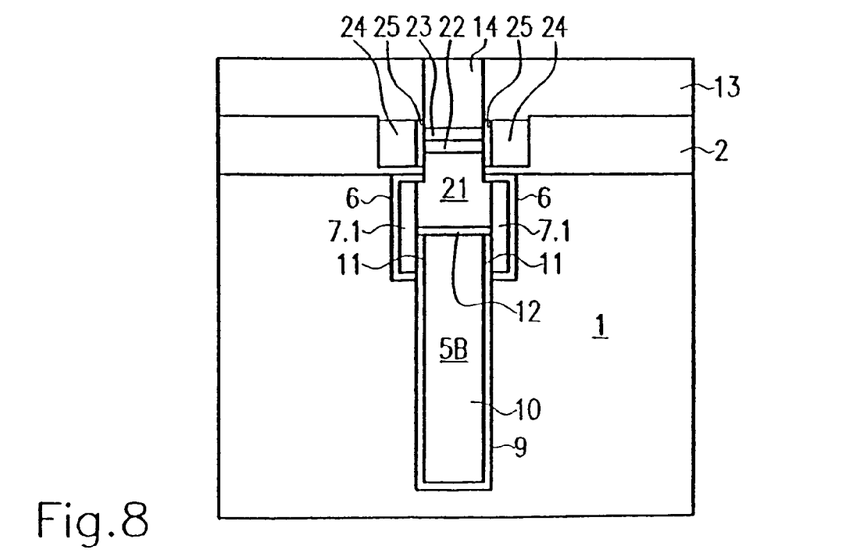
FIG. 8 shows the memory cell after contact has been made with the bit line.

FIG. 9 indicates the cross-sectional plane 8-8 along which the illustration shown in FIG. 8 was taken.

After the trenches have been etched into the STI layer 2, the gate oxide 25 is produced, and then the gate electrode layer 25 is deposited in the trenches. The gate electrode layer 24 used may optionally be a pure polysilicon gate or a layer sequence comprising a metal and polysilicon. After the gate electrode layer 24 has been deposited, the gate electrode material on the STI layer 2 is removed by means of chemical mechanical polishing. The gate electrode 24 can then still be etched back slightly, in order to ensure that it does not overlap the upper source/drain layer 23 of the select transistor. The result of these method steps is illustrated in FIG. 7.

Then, a dielectric interlayer 13 is deposited on the transistors 20 and the word lines 24.1, 24.2. Above the memory cells, recesses are etched into this interlayer down as far as the upper source/drain layer 23 of the select transistor, and a conductive material, such as polysilicon, is deposited in these recesses and, after deposition, is polished back by means of a CMP process, so that suitable through-contacts 14 are formed. Bit lines 15 can then be applied to these contacts in a direction which is orthogonal to the word lines and contact can be made between these bit lines and the through-contacts 14. Three bit lines 15 are illustrated in FIG. 9.

It is therefore intended that the foregoing detailed description be regarded as illustrative rather than limiting, and that it be understood that it is the following claims, including all equivalents, that are intended to define the spirit and scope of this invention.

The invention claimed is:

1. A memory cell, comprising:
   a trench capacitor having a trench formed in a semiconductor substrate, the trench defining a lower trench region in which a lower capacitor electrode adjoins a wall of the trench, the trench including a storage dielectric and an upper capacitor electrode comprised of an electrically conductive trench filling;
   a vertical field-effect transistor arranged above the trench capacitor as a select transistor having a first source/drain region, wherein the first source/drain region is arranged above the upper capacitor electrode and, in a cross-section, the upper capacitor electrode is arranged symmetrically to a vertically oriented center axis extending through the first source/drain region; and
   a ring-shaped contact-making region having
      a lower section surrounding an upper section of the upper capacitor electrode, and
      an upper section surrounding a lower section of the first source/drain region.

2. The memory cell of claim 1, comprising an insulation layer being deposited on an upper end section of the upper capacitor electrode, the first source/drain region being applied to the insulation layer.

3. The memory cell of claim 1, wherein the lower capacitor electrode is provided by doping the semiconductor substrate.

4. The memory cell of claim 1, wherein the ring-shaped contact-making region comprises substantially monocrystalline doped semiconductor material, and the first source/drain region is grown substantially epitaxially on the ring-shaped contact-making region.

5. The memory cell of claim 4, comprising an insulation layer being deposited on an upper end section of the upper capacitor electrode, the first source/drain region being applied to the insulation layer.

6. The memory cell claim 5, wherein the upper end section of the upper capacitor electrode has a surface comprising a polycrystalline semiconductor material.

7. The memory cell of claim 5, wherein the upper end section of the upper capacitor electrode has a surface comprising a metal-containing material.

8. The memory cell of claim 5, comprising a tunnel contact layer between the ring-shaped contact-making region and the upper end section of the upper capacitor electrode.

9. The memory cell of claim 8, comprising a second insulation layer between the contact-making region and the surrounding semiconductor substrate.

10. The memory cell of claim 1, wherein the select transistor defines a layer sequence including the first source/drain layer, a channel layer, and a second source/drain layer, the layer sequence being surrounded, at least in the region of the channel layer, by a gate electrode layer and by a gate oxide layer located between the channel layer and the gate electrode layer, the gate electrode layer having a substantially oval peripheral contour.

11. The memory cell of claim 10, wherein the memory cell is formed in the semiconductor substrate and an insulation layer on the semiconductor substrate, the gate electrode layer being formed within the insulation layer.

12. The memory cell of claim 11, wherein the ring-shaped contact-making region extends for a length of an interface between the semiconductor substrate and the insulation layer.

13. The memory cell of claim 10, wherein the layer sequence is vertically structured in such a manner that it has a substantially rectangular or oval cross section.

14. The memory cell of claim 13, wherein the memory cell is formed in the semiconductor substrate and an insulation layer on the semiconductor substrate, the gate electrode layer being formed within the insulation layer.

15. The memory cell as claimed in claim 14, wherein the ring-shaped contact-making region extends for a length of an interface between the semiconductor substrate and the insulation layer.

16. A memory cell arrangement having a plurality of memory cells, each memory cell comprising:
  a trench capacitor having a trench formed in a semiconductor substrate, the trench defining a lower trench region in which a lower capacitor electrode adjoins a wall of the trench, the trench including a storage dielectric and an electrically conductive trench filling an upper capacitor electrode, wherein the upper capacitor electrode is coupled to a first source/drain region of the select transistor by a contact-making region, the contact-making region at least partially surrounding the periphery of an upper end section of the upper capacitor electrode, wherein a lower section of the contact-making region substantially surrounds the upper end section of the upper capacitor electrode and an upper section of the contact-making region substantially surrounds the source/drain region; and
  a vertical field-effect transistor being arranged above the trench capacitor as a select transistor, wherein the select transistor defines a layer sequence including the first source/drain layer, a channel layer and a second source/drain layer, the layer sequence being surrounded, at least in the region of the channel layer, by a gate electrode layer, and by a gate oxide layer located between the channel layer and the gate electrode layer, the gate electrode layer having a substantially oval peripheral contour, wherein the memory cell is formed in the semiconductor substrate and an insulation layer on the semiconductor substrate, the gate electrode layer being formed within the insulation layer, and wherein the gate electrode layers of adjacent memory cells are coupled in such a manner that their oval peripheral contours overlap one another in a section, and the gate electrode layers coincide in this section.

17. The memory cell arrangement of claim 16, comprising:
  a plurality of memory cells arranged in a matrix, each of the plurality of memory cells being coupled to at least one of a plurality of word lines and at least one of a plurality of bit lines, the word lines being formed by gate electrode layers of memory cells configured along one of two orthogonal directions, and the bit lines being coupled to the select transistors in the other of the two orthogonal directions and coupled to the second source/drain layers thereof.

* * * * *